United States Patent
Wang et al.

(10) Patent No.: US 6,417,566 B1
(45) Date of Patent: Jul. 9, 2002

(54) VOID ELIMINATING SEED LAYER AND CONDUCTOR CORE INTEGRATED CIRCUIT INTERCONNECTS

(75) Inventors: Pin-Chin Connie Wang, Menlo Park; Amit P. Marathe, Milpitas, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/705,121

(22) Filed: Nov. 1, 2000

(51) Int. Cl.[7] ............................................. H01L 23/48
(52) U.S. Cl. ........................................ 257/750; 257/751
(58) Field of Search ................................ 257/762, 751, 257/745, 750

(56) References Cited

U.S. PATENT DOCUMENTS 6,001,461 A * 12/1999 Toyoda et al. ............... 428/210
6,181,012 B1 * 1/2001 Edelstein et al. ............ 257/762

* cited by examiner

Primary Examiner—Richard Elms
Assistant Examiner—Bradley Smith
(74) Attorney, Agent, or Firm—Mikio Ishimaru

(57) ABSTRACT

An integrated circuit and manufacturing method therefor is provided having a semiconductor substrate with a semiconductor device. A device dielectric layer is formed on the semiconductor substrate and a channel dielectric layer on the device dielectric layer has an opening formed therein. A barrier layer lines the channel opening and a conductor core fills the opening over the barrier layer. A seed layer is disposed between the barrier layer and the conductor core. The seed layer has an associated element which is formed during annealing into an intermetallic compound which has a density lower than the density of the conductor core.

9 Claims, 2 Drawing Sheets

VOID ELIMINATING SEED LAYER AND CONDUCTOR CORE INTEGRATED CIRCUIT INTERCONNECTS

TECHNICAL FIELD

The present invention relates generally to semiconductor technology and more specifically to eliminating voids in integrated circuit interconnects in semiconductor devices.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electro-less, physical vapor, or chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "cap" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon oxide, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon oxide, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "cap" layer and the "dual" damascene process is completed.

The layer may be processed further for placement of additional levels of channels and vias over it.

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem occurs during a "cooling" step which is performed after annealing the copper deposited in the channels. The copper in the channels tends to shrink because the thermal coefficient of expansion of copper is higher than that of the dielectric layers. As a result of the shrinkage of the copper, voids form in the copper in different locations, but most often in the via.

It is the voids in the via which are probably the most problematic since they increase the resistance in the via.

Further, the voids in the via contribute to the formation of larger voids due to increased electromigration of the copper atoms through the void restricted via during operation of the semiconductor device. The voids can grow to the point where open circuits occur which lead to the failure of the integrated circuit.

Solutions to these problems have been long sought but have long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A barrier layer lines the opening, and a conductor core fills the opening over the barrier layer. A seed layer is disposed between the barrier layer and the conductor core. The seed layer has an associated element which is formed into an intermetallic compound which has a density lower than the density of the conductor core. The intermetallic compound reduces or eliminates voids in the conductor core.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening and a seed layer is deposited to line the barrier layer. An element having a density less than the density of the conductor core is provided wherein an intermetallic compound is formed with a conductor core when the conductor core is deposited and annealed. The intermetallic compound counterbalances any shrinkage of the conductor core and reduces or eliminates void formation.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
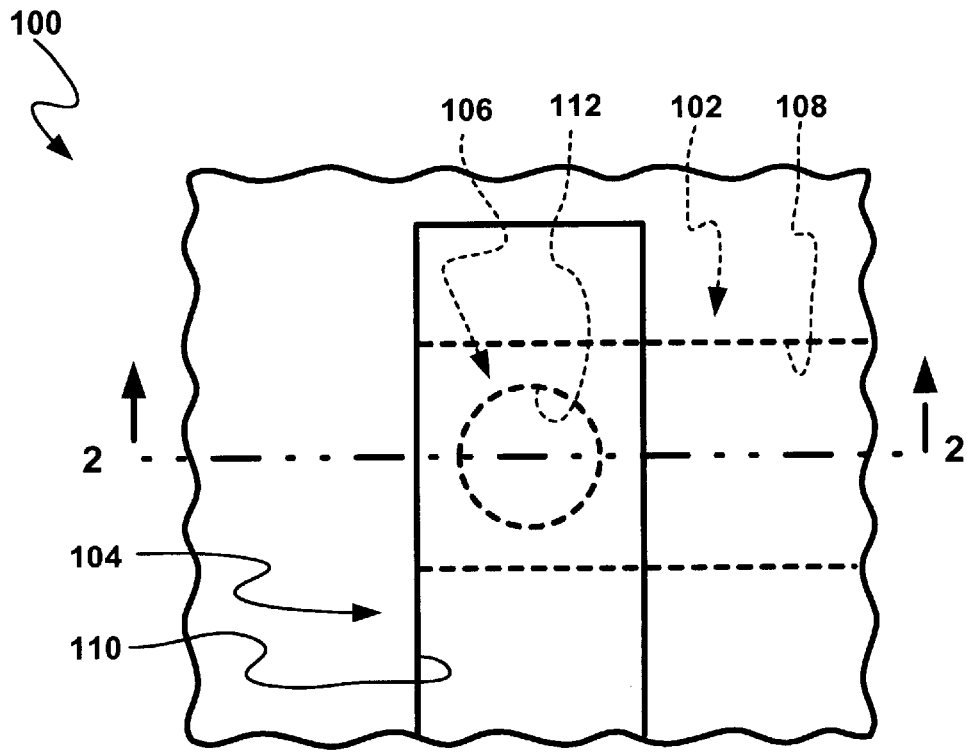
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
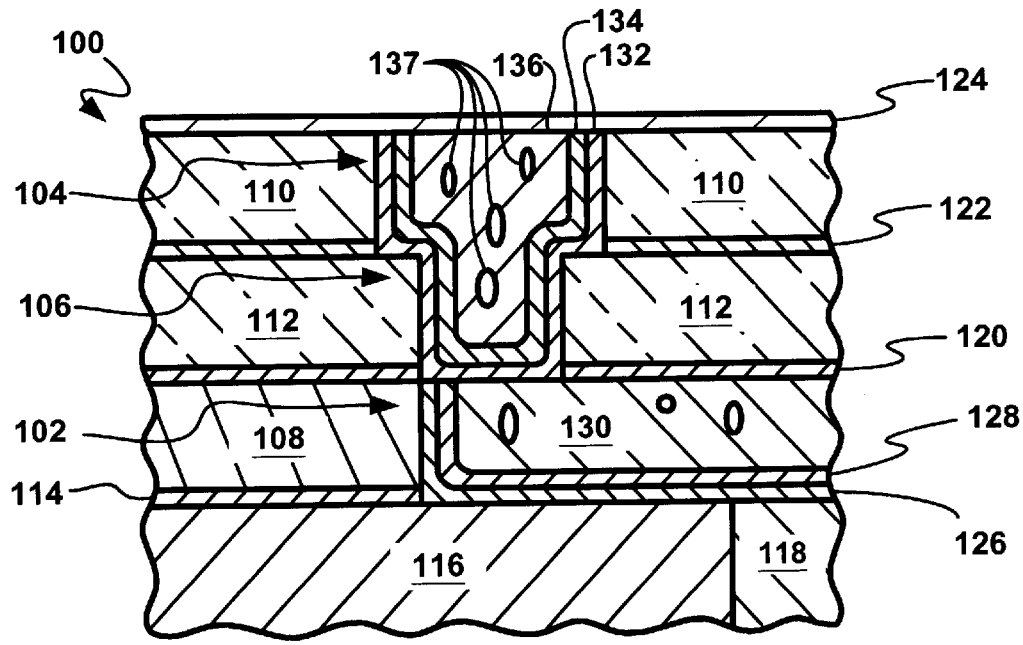
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1 (PRIOR ART).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

During annealing of the semiconductor wafer 100 to complete formation of the first and second channels 102 and 104 and the via 106, the copper will expand and during a "cooling" step, the copper will shrink so as to form voids 137 in the first and second channels 102 and 104 and the via 106. It is the voids 137 in the via 106 which are probably the most problematic since they increase the resistance in the via and would further contribute to the formation of larger voids due to electromigration through the void restricted via 106 during operation.

Figure 3:
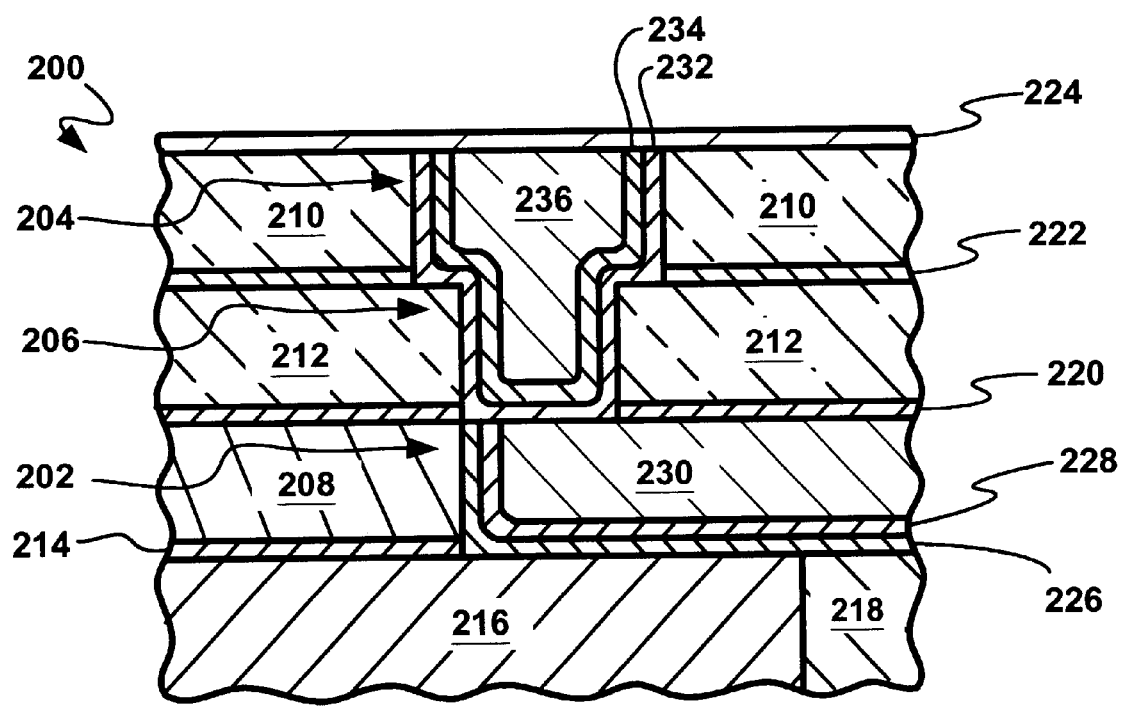
FIG. 3 is a cross-section of a semiconductor wafer of the present invention similar to that shown in FIG. 2 (PRIOR ART).

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second channel dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 are deposited. The seed layers 228 and 234 are of substantially the same conductor material as the conductor cores 230 and 236 and become part of the respective conductor cores 230 and 236 after the deposition.

In the present invention, the seed layers 228 and 234 have an associated element which will counterbalance the shrinkage in the conductor cores 230 and 236 after an annealing process.

The element can be associated with a seed layer by deposition during the deposition of the seed layer, doping after deposition of the seed layer, deposition as a layer on the seed layer, or deposition as part of the conductor core deposition.

The element must form an intermetallic compound, which has a lower density than the associated conductor core.

Further, the element has to have a very low solid solubility in the material of the conductor core which means is has less than 0.1 atomic percent solubility in the conductor core near room temperature (room temperature is used because it is difficult to measure solid solubility at low temperature, since reaching equilibrium requires a long time).

Where the conductor cores 230 and 236 are of copper, an example would be zirconium (Zr). The initial zirconium can be just in the seed layer in alloy form (CuZr), in pure element form (i.e., as Cu/Zr bilayer), or introduced throughout the copper by electroplating, chemical vapor deposition, etc. Zirconium and copper are both face centered cubic (FCC) metals, which are the most densely packed crystalline structures, while the intermetallic compound of $Cu_9Zr_2$ is a tetragonal structure, which is not as densely packed. Thus, by forming $Cu_9Zr_2$ during annealing, the overall volume will increase as compared to Cu/Zr. After the wafer is annealed, the intermetallic compound expands in volume to counterbalance the volume shrinkage of the pure copper upon cooling.

The annealing temperature is less than 450° C. and the cooling rate would be between 1° C. per minute up to 10° C. per second.

As evident by reference to FIG. 3, there will be no voids 137 as shown in FIG. 2 (PRIOR ART).

In various embodiments, the barrier layers are of materials such as tantalum (Ta), titanium (Ti), tungsten (W), nitrides thereof, and combinations thereof. The seed layers (where used) are of materials such as copper (Cu), gold (Au), silver (Ag), alloys thereof and combinations thereof with one or more of the above elements. The conductor cores with or without seed layers are of materials such as copper, aluminum (Al), gold, silver, alloys thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric materials such as hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon;
   a first dielectric layer formed over the semiconductor substrate having an opening provided therein;
   a conductor core filling the opening and connected to the semiconductor device, the conductor core of a conductor core material; and
   a seed layer lining the first dielectric layer; and
   an element associated with the seed layer and the conductor core formed into an intermetallic compound having a density lower than the density of the conductor core, the intermetallic compound counterbalancing volume shrinkage of the conductor core material due to annealing of the semiconductor substrate.

2. The integrated circuit as claimed in claim 1 wherein the element has a solid solubility of less than 0.1 atomic percent solubility in the conductor core near room temperature.

3. The integrated circuit as claimed in claim 1 wherein the element is zirconium.

4. The integrated circuit as claimed in claim 1 wherein the conductor core contains a material selected from a group consisting of copper, aluminum, gold, silver, a compound thereof, and a combination thereof.

5. An integrated circuit comprising:
   a semiconductor substrate having a semiconductor device provided thereon;
   a device dielectric layer formed on the semiconductor substrate;
   a first channel dielectric layer formed on the device dielectric layer having a first channel opening provided therein;
   a barrier layer lining the first channel opening;
   a first conductor core filling the first channel opening and connected to the semiconductor device, the first conductor core of a conductor core material;
   a seed layer lining the barrier layer;
   a first element associated with the seed layer and the first conductor core formed into an intermetallic compound having a density lower than the density of the conductor core, the intermetallic compound counterbalancing volume shrinkage of the conductor core material due to annealing of the semiconductor substrate;
   a via dielectric layer formed over the first channel dielectric layer, the barrier layer, the seed layer, and the first conductor core and having a via opening provided therein open to the first conductor core;

a second channel dielectric layer formed over the second channel stop layer and having a second channel opening provided therein open to the via opening;

a second barrier layer lining the second channel opening and via opening;

a second conductor core filling the second channel and via openings and connected to the first conductor core, the second conductor core of the conductor core material;

a second seed layer lining the second barrier layer and containing the element having a density less than the density of the material of the second conductor core; and second element associated with the seed layer and the conductor core formed into a second intermetallic compound having a density lower tan the density of the conductor core, the second intermetallic compound counterbalancing volume shrinkage of the conductor core material due to annealing of the semiconductor substrate.

6. The integrated circuit as claimed in claim 5 wherein the elements have a solid solubility of less than 0.1 atomic percent solubility in the conductor core near room temperature.

7. The integrated circuit as claimed in claim 5 wherein the elements are the same and are zirconium.

8. The integrated circuit as claimed in claim 5 wherein the conductor cores contain materials selected from a group consisting of copper, gold, silver, an alloy thereof, and a combination thereof.

9. The integrated circuit as claimed in claim 5 wherein the seed layers contain materials selected from a group consisting of copper, gold, silver, a compound thereof, and a combination thereof.

* * * * *